(12) United States Patent
Hong et al.

(10) Patent No.: US 6,895,666 B2
(45) Date of Patent: May 24, 2005

(54) UNDERFILL SYSTEM FOR SEMICONDUCTOR PACKAGE

(75) Inventors: Seong-Jae Hong, Chungcheongnam-do (KR); Joong-Hyun Baek, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 342 days.

(21) Appl. No.: 10/036,983

(22) Filed: Dec. 31, 2001

(65) Prior Publication Data

US 2002/0090750 A1 Jul. 11, 2002

(30) Foreign Application Priority Data

Jan. 10, 2001 (KR) .......................................... 2001-1306

(51) Int. Cl.⁷ ................................................. H05K 3/30
(52) U.S. Cl. .............................. 29/841; 29/740; 29/743; 29/832; 29/834; 438/126
(58) Field of Search .......................... 29/734, 737, 743, 29/752, 832, 834, 836, 837, 841, DIG. 44, 740; 361/678, 695; 438/107, 126; 901/40

(56) References Cited

U.S. PATENT DOCUMENTS

| | | | |
|---|---|---|---|
| 5,866,442 A | | 2/1999 | Brand .......................... 438/108 |
| 6,048,656 A | * | 4/2000 | Akram et al. ................ 438/119 |
| 6,253,834 B1 | * | 7/2001 | Sterner ........................ 361/687 |
| 6,534,345 B1 | * | 3/2003 | Muff et al. .................. 438/127 |

* cited by examiner

Primary Examiner—A. Dexter Tugbang
Assistant Examiner—Donghai D. Nguyen
(74) Attorney, Agent, or Firm—Marger Johnson & McCollom, P.C.

(57) ABSTRACT

An underfill system for filling gaps between semiconductor chips and substrates is provided. The underfill system comprises a blower for blowing air, an air duct coupled to the blower, the air duct comprising a main duct coupled to the blower and a plurality of sub-ducts each having an outlet being connected to the main duct and an inlet to be located along one side of the semiconductor chip. A filling material from a dispenser fills the gaps by suction due to the pressure difference between the main duct and the sub-duct. Thus, the present invention shortens the filling time of the underfill process and prevents voids or air bubbles of the filling material from forming within the gap.

11 Claims, 3 Drawing Sheets

UNDERFILL SYSTEM FOR SEMICONDUCTOR PACKAGE

This application relies for priority upon Korean Patent Application No. 2001-1306, filed on Jan. 10, 2001, the contents of which are herein incorporated by reference in their entirety.

BACKGROUND OF THE INVENTION

1. Field of the Invention

The present invention relates to semiconductor packaging and, more particularly, to an underfill system for a semiconductor package that prevents voids or bubbles within a gap between a semiconductor chip and a substrate during an underfill process and which shortens the underfill time.

2. Description of the Related Arts

There are many bonding techniques for semiconductor devices, i.e., wire bonding, tape automated bonding (TAB), flip chip bonding, anisotropic conductive film (ACF) bonding, etc. Recent trends in electronics development are towards light weight, miniaturization, high speed, multi-functionalization, high quality, high reliability and so on. In order to satisfy these demands, the flip chip bonding technique has been introduced and widely employed.

The flip-chip bonding technique involves mounting a semiconductor chip onto a substrate through bonding bumps formed on the electrode pads of the semiconductor chip. Solder bumps, Au bumps or stud bumps are used. Solder bumps and Au bumps are formed by a plating method, while stud bumps are formed by a wire-bonding method.

After flip-chip bonding the semiconductor chip to the substrate, in order to prevent failures due to differences in thermal expansion coefficients of the semiconductor chip and the substrate, an underfill process for filling the gap between the semiconductor chip and the substrate with a filling material is performed. FIG. 1 is a cross-sectional view of a portion of a semiconductor package, where a gap between a semiconductor chip and a substrate is filled by the prior art underfill method.

As shown in FIG. 1, a dispensing method is conventionally used as the underfill method. After flip chip bonding bumps 14 attach a surface of a semiconductor chip 12 to a substrate 10, the gap between the semiconductor chip 12 and the substrate 10 is filled by injecting a liquid filling material 18 with a dispenser 16. Reference number 19 represents a piston 19 for injecting the filling material 18 into the gap.

In the above-described dispensing method, the filling speed of the filling material 18 is determined by surface tension between the semiconductor chip 12 and the substrate 10. The consequent long filling time of the filling material 18 and high number of bumps 14 cause voids or air bubbles to form within the gap.

In order to solve this problem, the filling speed of the filling material should be increased by supplying injection pressure or by performing the filling under vacuum conditions.

However, in case of supplying injection pressure so as to fill the gap with the filling material, the bumps may deviate from their earlier original positions by the filling speed of the filling material.

In case of supplying a vacuum condition, as disclosed in U.S. Pat. No. 5,866,442, an underfill apparatus using a vacuum condition requires additional equipment such as a pressure pump and a vacuum pump, thereby increasing the fabrication cost. Furthermore, since this apparatus cannot simultaneously carry out the underfill process to a plurality of the substrates, it reduces the production yield.

SUMMARY OF THE INVENTION

The present invention provides an underfill system for fabricating a semiconductor package, while preventing voids within the gap and shortening the underfill time with a low production cost.

Also, the underfill system can concurrently carry out the underfill process on a plurality of substrates.

According to one embodiment, an underfill system for filling gaps between semiconductor chips and substrates comprises a blower for blowing air, an air duct coupled to the blower, the air duct comprising a main duct connected to the blower and a plurality of sub-ducts each having an outlet being connected to the main duct and an inlet to be disposed along one side of the semiconductor chip. A filling material from a dispenser fills the gaps by suction due to the pressure difference between the main duct and the sub-duct.

Thus, the present invention shortens the filling time of the underfill process and prevents voids or air bubbles of the filling material from forming within the gap.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
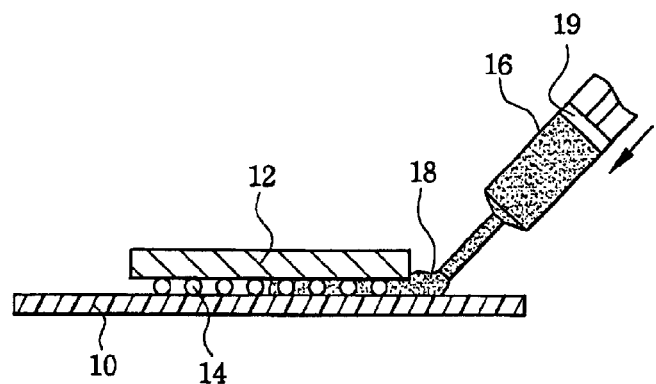
FIG. 1 is a cross-sectional view of a semiconductor package, where a gap between a semiconductor chip and a substrate is filled by the prior art underfill method.
Figure 2:
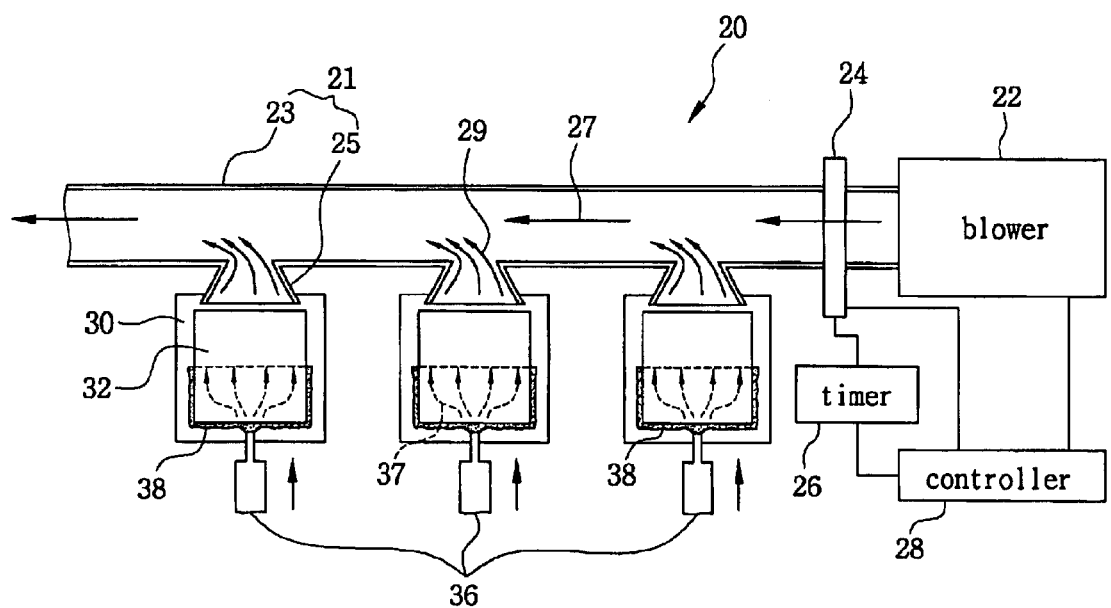
FIG. 2 is a schematic view of an underfill system for a semiconductor package in accordance with an embodiment of the present invention.

FIG. 2 is a schematic view of an underfill system 20 for a semiconductor package in accordance with an embodiment of the present invention. As shown in FIG. 2, the underfill system 20 comprises a blower 22 for providing air, an air duct 21 as a passage of air from the blower 22, and a filling material provider such as a dispenser 36 for providing a filling material 38 onto gaps between semiconductor chips 32 and substrates 30.

The blower 22 provides air at a predetermined speed along the air duct 21. A hydraulic-type, fan-type or pneumatic-type blowing system is used as the blower 22. However, any blowing system of providing air at a predetermined velocity may be used as the blower 22. Air provided from the blower 22 is at a temperature of 25° C. or higher. The reason for this will be described below.

The air duct 21 connected to the blower 22 comprises a main duct 23 and a plurality of sub-ducts 25 connected to the main duct 23 at a predetermined interval. The main duct 23 serves as a passage of air provided from the blower 22. One end of each sub-duct 25 is connected to the main duct 23 and the other end of each sub-duct 25 is close to one side of a semiconductor chip 32 on the upper surface of a substrate 30. The main duct 23 may have any type of cross-sectional shape, such as circular, oval, rectangular, square, or any other shape.

The dispenser 36 is formed on the opposite side of the semiconductor chip 32 and provides the filling material 38 to the gap between the semiconductor chip 32 and the substrate 30.

Under the condition of blowing air at a predetermined velocity along the main duct 23 by the blower 22, the dispenser 36 provides the filling material 38 to the gap between the semiconductor chip 32 and the substrate 30. Then, due to the pressure difference between the main duct 23 and the sub-ducts 25, air flows from the semiconductor chip 32 into the sub-duct 25, creating suction and filling the gap between the chip 32 and the substrate 30 with the filling material 38 from the dispenser side of the chip 32 to the sub-duct side of the chip 32. Moreover, air provided from the blower 22 is at a temperature of approximately 25° C. or higher, thereby increasing the pressure difference between the main duct 23 and the sub-duct 25. This shortens the filling time of the filling material 38. Herein, reference number 27 represents the direction of air flow within the main duct 23 and reference number 29 represents the direction of an air flow from the sub-duct 25 to the main duct 23. Reference number 37 represents the direction of the filling material 38 flow.

A valve 24 for controlling the speed of air blown from the blower 22 is located on the main duct 23. One end of a timer 26 for checking the underfilling time is connected to the valve 24 and the other end of the timer 26 is connected to a controller 28 for controlling the underfill system 20. Preferably, the valve 24 is located on a region of the main duct 23 between the first sub-duct 25 and the blower 22.

Figure 3:
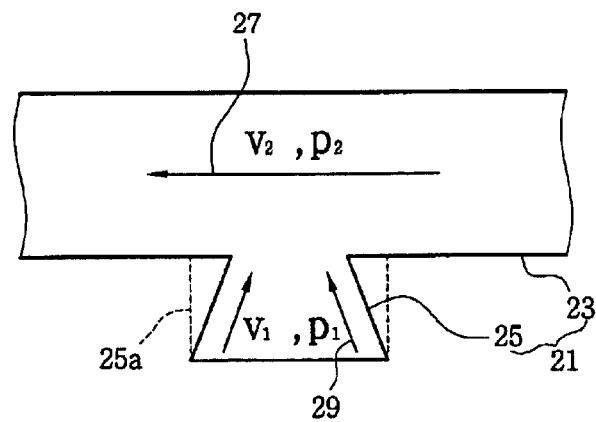
FIG. 3 is an enlarged schematic plan view illustrating the underfill principle of the underfill system of the present invention.

With reference to FIG. 3, the principle of assisting the movement of the filling material according to an embodiment of the present invention is described in detail below. When air at a predetermined speed $V_2$ is blown into the main duct 23, a pressure difference $P_2-P_1$ between the main duct 23 and the sub-duct 25 results. The pressure difference $P_2-P_1$ can be calculated by Bernoulli's Equation.

$$P_1 + \tfrac{1}{2}\rho V_1^2 + \rho g h_1 = P_2 + \tfrac{1}{2}\rho V_2^2 + \rho g h_2 \qquad \text{[Equation 1]}$$

When there is a pressure difference $P_2-P_1$ between the main duct 23 and the sub-duct 25, air can be injected from the sub-duct 25 into the main duct 23, thereby increasing the speed at which the filling material fills the gap between the semiconductor chip 32 and the substrate 30. Herein, the filling time $t_{fill}$ of the filling material can be calculated by Equation 2 described below.

$$t_{fill} = 6\eta L^2/\epsilon P h \qquad \text{[Equation 2]}$$

Herein, eta represents the viscosity of the filling material, and L represents a length from one side to the other side of the semiconductor chip. $\epsilon P$ represents the pressure difference $P_2-P_1$ between the main duct 23 and the sub-duct 25, and h represents the distance between the substrate and the semiconductor package.

As shown in Equation 2, the greater the pressure difference $\epsilon P$ between the main duct 23 and the sub-duct 25, the shorter the filling time of the filling material.

As shown in Equation 1, the pressure difference is determined by the speed $V_2$ of air blown into the main duct 23, the length of the sub-duct 25, and the ratio of the width of the inlet of the sub-duct 25 to the width of the outlet of the sub-duct 25 connected to the main duct 23. Reference number 25a shown in a dotted line represents a sub-duct with a constant inner diameter.

Figure 4:
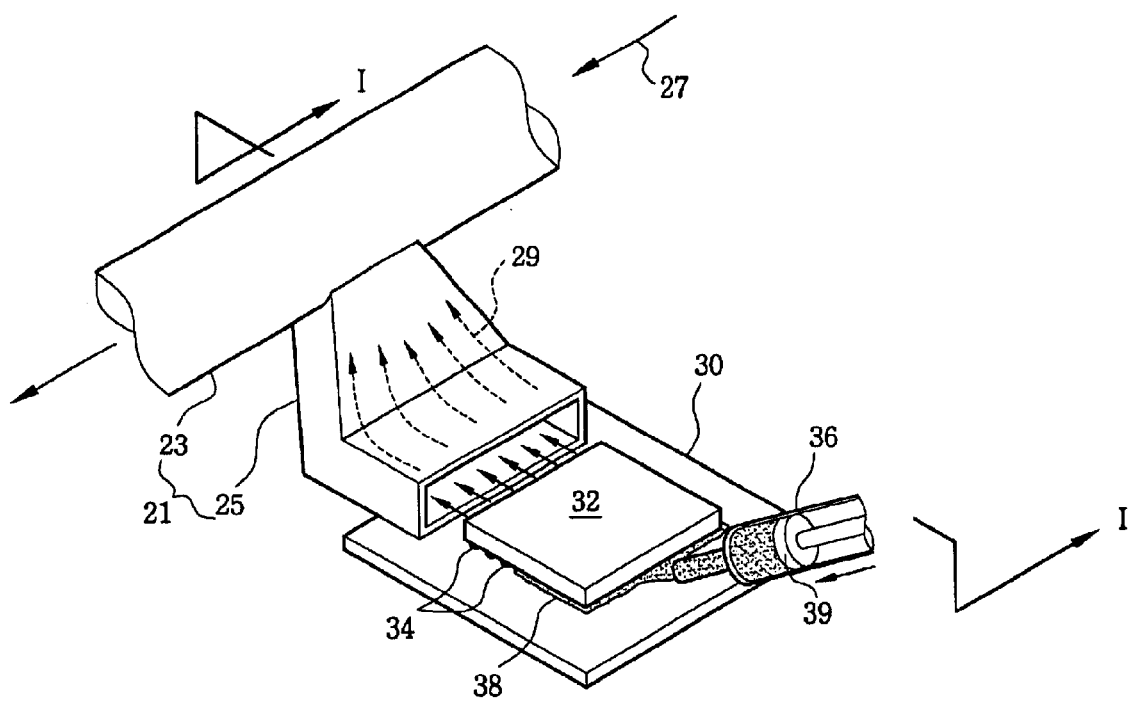
FIG. 4 is a perspective view showing a step of underfilling a gap between a semiconductor chip and a substrate with a liquid filling material in accordance with the present invention.
Figure 5:
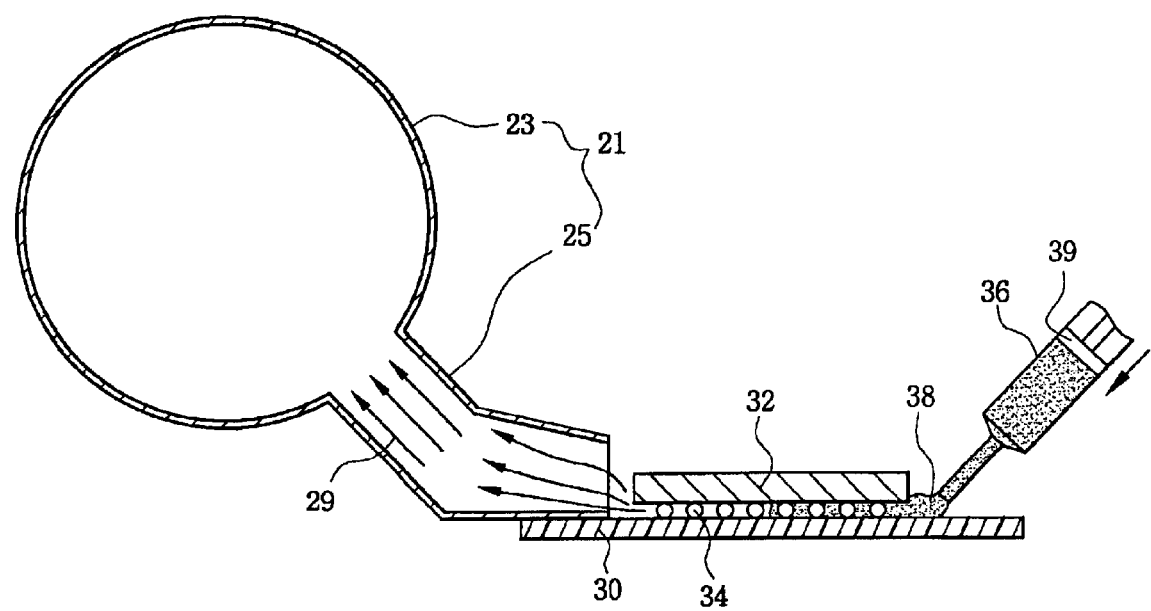
FIG. 5 is a cross-sectional view taken along the line I—I in FIG. 4.

Referring to FIGS. 2, 4 and 5, an underfill process using the underfill system 20 with the above-described structure is described below. The underfill process starts with the preparation of the substrates 30, to each of which a semiconductor chip 32 is flip-chip bonded. The underfill process is accomplished at a temperature of approximately 80° C. to 110° C.

Next, the substrates 30 are located next to the inlets of the sub-ducts 25. Although this embodiment of the present invention comprises the sub-ducts 25 disposed on one side of the main duct 23, the sub-ducts 25 can be disposed on both sides of the main duct 23.

The blower 22 blows air at a predetermined velocity along the main duct 23, and the dispenser 36 provides the filling material 38 to the upper surface of the substrate 30. Then, the filling material 38 fills the gap between the chip 32 and the substrate 20 in a direction from the dispenser 38 toward the sub-ducts 25. That is, the filling material 38 is introduced into the gap by the surface tension between the semiconductor chip 32 and the substrate 30, and by the air flown from the semiconductor chip 32 to the sub-ducts 25, creating a suction that draws the filling material 38 across the chip/substrate gap. In order to fill a plurality of gaps at the same rate, it is preferable to constantly maintain the velocity of air flown along the main duct 23.

The timer 26 checks the filling time of the filling material 38 and transmits the data of the filling time to the controller 28. When the controller 28 receives the data from the timer 26, the controller 28 closes the valve 24, thereby blocking the flow of air along the main duct 23. Then, the underfill process is completed.

In order to prevent the filling material 38 from being injected into the sub-ducts 25, the inlets of the sub-ducts 25 are spaced from the gap between the semiconductor chips 32 and the substrates 30 at a predetermined distance. Alternatively, prior to completely filling the gap with the filling material 38, when the gap is incompletely filled by about ¾, air flow from the sub-duct 24 into the main duct 23 is blocked and the gap is completely filled by inertia of earlier air flow and surface tension between the semiconductor chip 32 and the substrate 30.

The present invention shortens the filling time of the underfill process and prevents voids or air bubbles of the filling material from forming within the gap.

Moreover, the underfill system of the present invention comprises a main duct and a plurality of sub-ducts, thereby simultaneously carrying out the underfill process on a plurality of substrates. At this time, by constantly maintaining the speed of the air flowing along the main duct, the underfill process on plural substrates can be completed concurrently.

Further, the underfill system of the present invention uses conventional dispensing equipment with a modification for forming additional air ducts, thereby cutting down the production cost.

Although the preferred embodiments of the present invention have been described in detail hereinabove, it should be understood that many variations and/or modifications of the basic inventive concepts apparent to those skilled in the art will still fall within the spirit and scope of the present invention as defined in the appended claims.

What is claimed is:

1. An underfill system for filling gaps between semiconductor chips and substrates, comprising:

an air duct; and a blower configured to blow air into said air duct, wherein said air duct includes:

a main duct coupled to said blower, and a plurality of sub-ducts each having an outlet being coupled to said main duct and an inlet of the sub-ducts to be disposed on one side surface of said semiconductor wherein said one side surface having a first edge and a second edge, said second edge being longer than said first edge, and a dispenser configured to provide a filling material to fill said gaps between said semiconductor chips and said substrates by suction due to a pressure difference between said main duct and said sub-duct, wherein said inlet extends along substantially the entire length of said second edge of said one side surface of said semiconductor chip.

2. The underfill system as claimed in claim 1, wherein said outlet of the sub-duct is of a smaller width than said inlet of the sub-duct.

3. The underfill system as claimed in claim 1, further comprising a valve for controlling the velocity of air blown from said blower, wherein said valve is located on said main duct between the blower and the sub-ducts.

4. The underfill system as claimed in claim 3, further comprising a timer that closes said valve to block air blown from said blower into said main duct.

5. The underfill system as claimed in claim 1, wherein said air blown from said blower is at a temperature of approximately 25° C. or higher.

6. The underfill system as claimed in claim 1, wherein the blower comprises a hydraulic-type blower.

7. The underfill system as claimed in claim 1, wherein the blower comprises a fan-type blower.

8. The underfill system as claimed in claim 1, wherein the blower comprises a pneumatic-type blower.

9. A method for filling gaps between semiconductor chips and substrates using an underfill system comprising a blower structured to blow air, an air duct coupled to said blower, the air duct comprising: a main duct connected to said blower; and a plurality of sub-ducts each having an outlet being connected to said main duct and an inlet to be disposed on one side surface of said semiconductor chip, the inlet of the sub-duct forming a suction when the blower blows air in the air duct, and said one side surface having a first edge and a second edge, said second edge being longer than said first edge, the method comprising:

mounting said semiconductor chips onto said substrates placing one of said substrates in the suction of one of the sub-ducts; and filling said gaps between said semiconductor chips and said substrates with a filling material from a dispenser by creating suction that draws the filing material across said gaps, the filling material provided in a direction toward the inlet of the one of the sub-ducts, wherein said inlet extends along substantially the entire length of said second edge of said one side surface of said semiconductor chip.

10. The method of claim 9, further comprising:

blocking the flow of air along the main duct.

11. The method of claim 9, wherein creating suction comprises increasing the pressure difference between said main duct and said sub-duct.

* * * * *

UNITED STATES PATENT AND TRADEMARK OFFICE
CERTIFICATE OF CORRECTION

PATENT NO. : 6,895,666 B2 Page 1 of 1
APPLICATION NO. : 10/036983
DATED : May 24, 2005
INVENTOR(S) : Hong et al.

It is certified that error appears in the above-identified patent and that said Letters Patent is hereby corrected as shown below:

At column 5, line 13, please replace "semiconductor wherein" with --semiconductor chip, wherein--
At column 5, lines 16 and 17, please replace "and ¶ a dispenser" with --and a dispenser--

Signed and Sealed this

Twelfth Day of December, 2006

JON W. DUDAS
*Director of the United States Patent and Trademark Office*